US012663494B2

(12) United States Patent
Cassagne

(10) Patent No.: US 12,663,494 B2
(45) Date of Patent: Jun. 23, 2026

(54) ELECTRICAL VERIFICATION CIRCUIT FOR A CURRENT CLAMP, CORRESPONDING CURRENT CLAMP, AND CORRESPONDING VERIFICATION METHOD

(71) Applicant: TOTALENERGIES RENEWABLES, La Défense (FR)

(72) Inventor: Valérick Cassagne, Limours (FR)

(73) Assignee: TOTALENERGIES RENEWABLES, Courbevoie (FR)

( * ) Notice: Subject to any disclaimer, the term of this patent is extended or adjusted under 35 U.S.C. 154(b) by 57 days.

(21) Appl. No.: 18/580,655

(22) PCT Filed: Jun. 29, 2022

(86) PCT No.: PCT/EP2022/067944
§ 371 (c)(1),
(2) Date: Feb. 5, 2024

(87) PCT Pub. No.: WO2023/001513
PCT Pub. Date: Jan. 26, 2023

(65) Prior Publication Data
US 2024/0345197 A1      Oct. 17, 2024

(30) Foreign Application Priority Data
Jul. 23, 2021     (FR) ...................................... 2108034

(51) Int. Cl.
*G01R 35/00*         (2006.01)
*G01R 15/18*         (2006.01)
(52) U.S. Cl.
CPC ........... *G01R 35/00* (2013.01); *G01R 15/186* (2013.01)
(58) Field of Classification Search
None
See application file for complete search history.

(56) References Cited

U.S. PATENT DOCUMENTS

| | | | |
|---|---|---|---|
| 10,359,494 B2 | 7/2019 | Epperson et al. | |
| 2008/0191705 A1* | 8/2008 | Bellan ................... | G01R 31/52 |
| | | | 324/529 |

(Continued)

FOREIGN PATENT DOCUMENTS

| | | |
|---|---|---|
| CN | 2629048 Y | 7/2004 |
| CN | 2758789 Y | 2/2006 |

(Continued)

OTHER PUBLICATIONS

International Search Report and Written Opinion for International application No. PCT/EP2022/067944, dated Sep. 2, 2022. (9 pages).

(Continued)

*Primary Examiner* — Jas A Sanghera
(74) *Attorney, Agent, or Firm* — Dilworth IP, LLC

(57) ABSTRACT

The invention relates to an electrical current-measurement verification circuit (100) for a DC current clamp (1), comprising: at least one electrical conductor (101) having at least one winding (101*a*) configured to be placed around a jaw (11) of the current clamp, said at least one conductor (101) being configured to be electrically connected to a DC power source so as to have a direct current of predetermined intensity (I) pass therethrough, and a switch (105) electrically connected to said at least one conductor (101) and configured to adopt at least one position preventing the flow of current in said at least one conductor (101) and one position allowing the flow of current in said at least one conductor (101). The invention also relates to a current clamp incorporating such an electrical circuit (100). The invention also relates to a verification method using such an electrical circuit (100).

11 Claims, 3 Drawing Sheets

(56) References Cited

U.S. PATENT DOCUMENTS

| | | | | |
|---|---|---|---|---|
| 2013/0076343 A1* | 3/2013 | Carpenter | ................ | G01R 1/22 |
| | | | | 324/252 |
| 2018/0136303 A1 | 5/2018 | Epperson et al. | | |
| 2019/0072632 A1 | 3/2019 | Huber | | |
| 2019/0311233 A1 | 10/2019 | Kouguchi | | |
| 2021/0165021 A1* | 6/2021 | Mogren | .............. | G01R 19/003 |

FOREIGN PATENT DOCUMENTS

| | | |
|---|---|---|
| CN | 1920580 A | 2/2007 |
| DE | 102011080874 A1 | 2/2013 |
| JP | 07-006766 U | 1/1995 |
| JP | 3046142 U | 2/1998 |
| JP | 2008-134142 A | 6/2008 |
| JP | 2009-069089 A | 4/2009 |
| JP | 2018-071996 A | 5/2018 |
| JP | 2018-136300 A | 8/2018 |
| JP | 2019-053052 A | 4/2019 |

OTHER PUBLICATIONS

European Office Action with English translation cited in EP 22736270. 4, dated Oct. 28, 2025, 12 pages.

Office Action received for Japanese Application No. 2024-504180, mailed on Apr. 3, 2026, 10 pages (5 pages of English Translation and 5 pages of Original Document).

* cited by examiner

ELECTRICAL VERIFICATION CIRCUIT FOR A CURRENT CLAMP, CORRESPONDING CURRENT CLAMP, AND CORRESPONDING VERIFICATION METHOD

CROSS-REFERENCE TO RELATED PATENT APPLICATIONS

This application is a U.S. National Stage Application under 35 U.S.C. § 371 of International Patent Application No. PCT/EP2022/067944 filed Jun. 29, 2022, which claims the benefit of priority of French Patent Application No. 2108034 filed Jul. 23, 2021, both of which are incorporated by reference in their entireties. The International Application was published on Jan. 26, 2023, as International Publication No. WO 2023/001513 A1.

The present invention relates to the field of photovoltaic installations, in particular photovoltaic systems and to their maintenance. More specifically, the present invention relates to an electrical circuit for verifying the current measurement for direct current (DC) clamps and a corresponding current clamp making it possible to verify the absence of current flowing in the photovoltaic string before servicing. The invention also relates to a method for verifying the current measurement of a DC current clamp, by means of such an electrical circuit.

Due to global warming, political choices, and the need for an energy transition, energy consumption is increasingly geared toward sustainable development that environmentally friendly and emits less greenhouse gas. This trend is naturally leading to renewable energies such as solar energy, including photovoltaic energy.

A photovoltaic module constitutes one of the general devices for the conversion of solar energy into electrical energy. It essentially comprises photovoltaic cells, for example made of silicon, capable of converting the sun's electromagnetic radiation into DC electrical energy thanks to the photovoltaic effect of the components of these photovoltaic cells. The photovoltaic cells forming the photovoltaic module are interconnected on a common support element. It may for example be in the form of a module.

Several photovoltaic modules can be interconnected in series in order to form a photovoltaic string. Such a photovoltaic string is generally connected by an inverter to the grid or to a facility where the electrical energy produced is consumed. The inverter makes it possible to transform the direct current generated by the photovoltaic cells into alternating current. The photovoltaic string also comprises two cables, forming the outbound and return paths between the modules and the inverter.

The installation and subsequent operation and maintenance of the photovoltaic string may present a safety issue, as the voltage is running in the photovoltaic string as long as the sun is shining and is uninterruptible. An important safety rule is not to disconnect the photovoltaic string during operation or charging. This could create a very powerful electric arc, posing a serious electrification or burn hazard to an operator.

To avoid this, and to limit the risk of opening the photovoltaic string as it is charging, a check should be performed to ensure that no current is flowing before disconnecting any conductive element or connector from the photovoltaic string.

One known solution is to use a DC current clamp, which can be opened and placed around a conductive element such as a cable, to measure the current flowing through the cable.

However, measurement by the current clamp may not be reliable, for example if the current clamp is damaged or fails, or if the current clamp is incorrectly calibrated or configured, for example if it is configured for AC current instead of DC current. Thus, even if current is flowing, it won't be measured.

One aim of the present invention is to provide a simple solution for verifying the correct operation/calibration of the DC current clamp, and thus making the safety procedure more reliable. A further aim of the invention is to enable simple, practical verification on a worksite.

To this end, the object of the invention is an electrical current measurement verification circuit for a DC current clamp, comprising:

at least one electrical conductor having at least one winding configured to be arranged around a jaw of the current clamp, said at least one conductor being configured to be electrically connected to a source of direct current so as to have a direct current of a predetermined intensity flowing through it, and a switch electrically connected to said at least one conductor and configured to take at least one position of preventing the current from running through said at least one conductor and one position for allowing the current to run through said at least one conductor.

This makes it possible to verify whether the current clamp is measuring an intensity value representative of the predetermined intensity flowing through said at least one conductor when the switch is in the allowing position.

Said circuit may further comprise one or more following features described below, taken separately or in combination.

Said at least one conductor may comprise at least two windings configured to be arranged around the jaw of the current clamp. Thus, when the switch is in the allowing position and said at least one conductor has direct current running through it, the intensity value to be measured by the current clamp corresponds to the predetermined intensity flowing through said at least one conductor, multiplied by the number of windings.

Said circuit may comprise a battery or at least one electric accumulator forming the DC source, arranged in series with the switch. Said at least one conductor is electrically connected to the terminals of the battery or of said at least one electrical accumulator.

Said at least one conductor, the battery or said at least one accumulator, and the switch form a closed loop.

Said circuit may comprise a light source arranged in series with the switch, and configured to emit light when the switch is in the allowing position and said at least one conductor has direct current running through it.

Said circuit can be mounted in a housing comprising an actuating member arranged on the housing in mechanical contact with the switch so as to be operable to drive the switch into the allowing position. The actuating member can be mounted so that it protrudes from the housing. Alternatively, the actuating member can be mounted flush with the outer surface of the housing.

The light source, for example, is arranged opposite a region of the housing made of a transparent or translucent light-transmitting material.

Optionally, the housing is separate from the clamp and has an opening around which said at least one conductor is wound inside the housing, and configured to be passed through by the jaw of the current clamp.

The invention also relates to a direct current (DC) clamp comprising an electrical circuit for verifying the current measurement as defined above.

The clamp comprises for example two jaws made of ferromagnetic material, a housing made of insulating material at least part of which is arranged around the jaws of said clamp, and said circuit is mounted in the housing of said clamp so that said at least one winding of said at least one conductor is arranged around the ferromagnetic material forming one of the jaws.

The invention also relates to a method for verifying the current measurement of a DC current clamp, by means of an electrical circuit for verifying current measurements as defined above. Said method comprises the following steps:

positioning said at least one winding of said at least one conductor around a jaw of the current clamp, if said circuit is mounted in a housing separate from the current clamp, placing the switch in the position allowing the current to run through said at least one conductor, verify whether the current clamp is measuring an intensity value representative of the predetermined intensity running through said at least one conductor.

Other features and advantages of the invention will become more clearly apparent on reading the following description, given by way of illustrative and non-limiting example, and of the appended drawings, in which.

In these figures, identical elements bear the same reference numbers.

Figure 1:
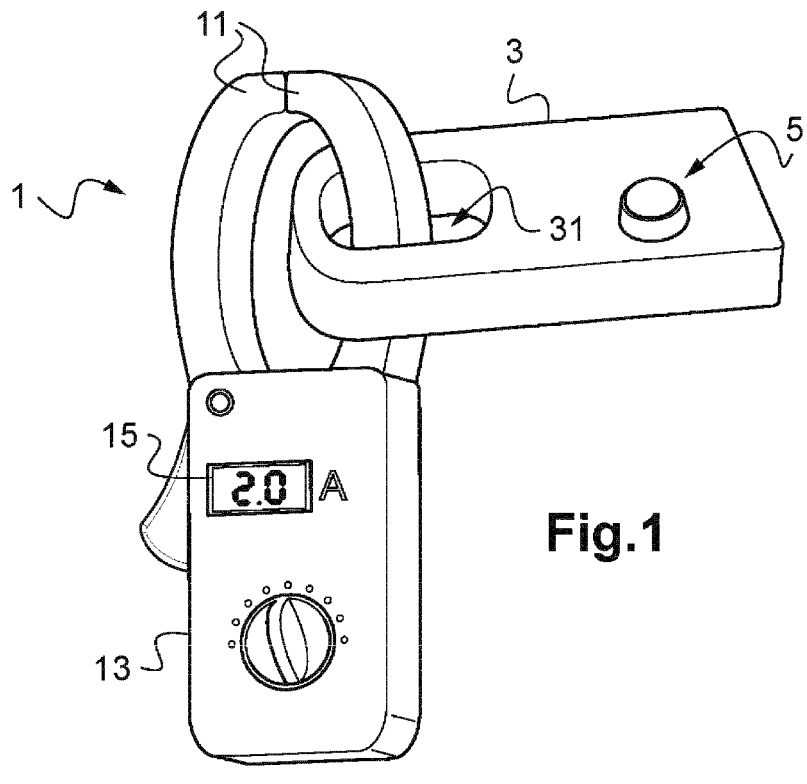
FIG. 1 shows a current clamp and a housing accommodating an electrical circuit for verifying the current measurement of the current clamp.

The following embodiments are examples. Although the description refers to one or more embodiments, this does not necessarily mean that each reference relates to the same embodiment, or that the features apply only to a single embodiment. Simple features of different embodiments may also be combined or interchanged to provide other embodiments.

The invention relates to the verification of an effective current measurement for a current clamp 1 shown schematically in FIGS. 1 to 6, in order to ensure that the current clamp 1 is functional and reliable, for example whether it is calibrated correctly depending on whether the current to be measured is a direct current or an alternating current, and that it is not faulty or damaged.

Such a current clamp 1 can be used in particular in the context of a photovoltaic facility (not shown) comprising at least one photovoltaic string formed from several interconnected photovoltaic modules. Such a photovoltaic string can be connected to a grid or to a facility where the electrical energy produced can be consumed by an inverter.

By way of example, the current clamp 1 is configured to measure whether a current is flowing in a conductive element or a connection element such as a cable. It may in particular be a cable making it possible for example to transfer or transmit the current generated by one or more photovoltaic modules to the grid or to the facility or to the inverter or any other energy converter, or a cable enabling the connection of different photovoltaic modules of the photovoltaic string to one another.

To this end, the current clamp 1 comprises two jaws 11, generally made of ferromagnetic material which can open and close. In particular, one of the jaws 11 may be intended to remain fixed, relative to the rest of the current clamp 1, while the other jaw 11 can be movable relative to the fixed jaw 11. The jaws 11 are shaped so that an element to be verified, such as a cable, for example, intended to be covered by a current to be measured, can be placed in the space formed between the jaws 11.

The current clamp 1 further comprises a housing made of an electrically insulating material, for example made of a plastic material. The housing comprises a part arranged around the ferromagnetic material forming the jaws 11.

The housing also includes another part delimiting a body 13 or handle of the current clamp 1, enabling it to be held by an operator, in order to be able to carry out current measurements on a site or worksite including, for example, the photovoltaic string. The body 13 is generally shaped to house one or more electrical and electronic components of the current clamp 1. Such components are in particular designed for a direct current measurement by the current clamp 1.

An element for viewing the measurement carried out by the current clamp 1, such as a display screen 15 for reading the intensity of the measured current, can be provided on this body 13.

Such a current clamp 1 as well as its operation are known and are not described in more detail.

Figure 5:
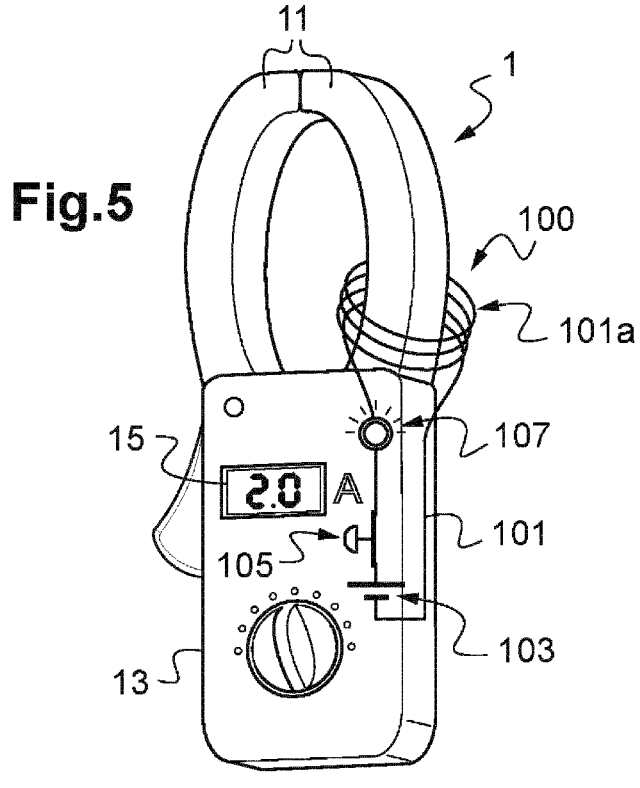
FIG. 5 shows an alternative of the electrical circuit carried by the current clamp.
Figure 6:
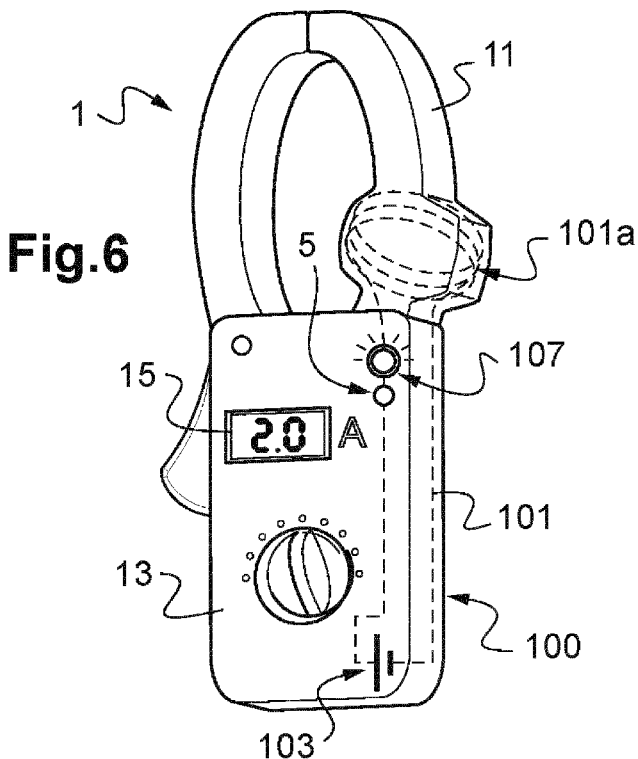
FIG. 6 shows a current clamp including the housing accommodating the electrical circuit.

The invention relates in particular to an electrical circuit for verifying the current measurement 100, hereinafter called electrical circuit 100. This electrical circuit 100 may be distinct from the current clamp 1 and mounted in a dedicated housing 3 (see FIG. 1). Alternatively, the electrical circuit 100 may be integrated into the current clamp 1 as shown in FIGS. 5 and 6. The differences between the alternative embodiments will be explained subsequently.

The electrical circuit 100 according to either of the variants shown in FIGS. 2 to 6 comprises at least one electrical conductor 101.

In general, this electrical conductor 101 is intended to be traversed by a direct current, so as to verify whether the current clamp 1 can measure this current, before using same, for example in the context of a photovoltaic string to ensure that no current is flowing therein.

Figure 2:
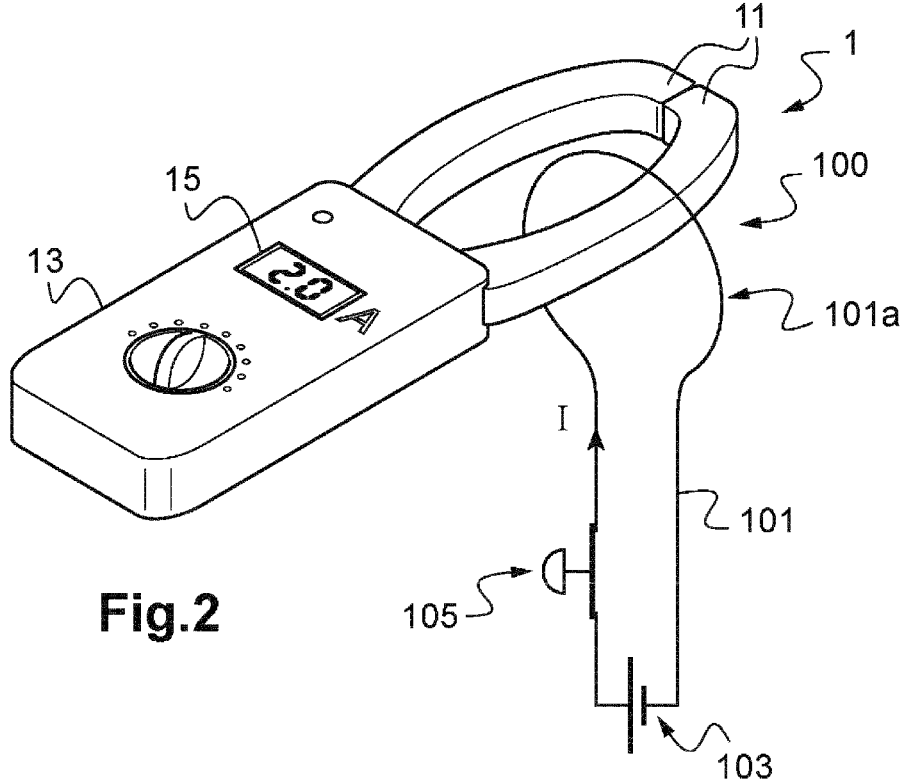
FIG. 2 is a view of the current clamp and the electrical circuit on which the housing accommodating the electrical circuit is removed.
Figure 3:
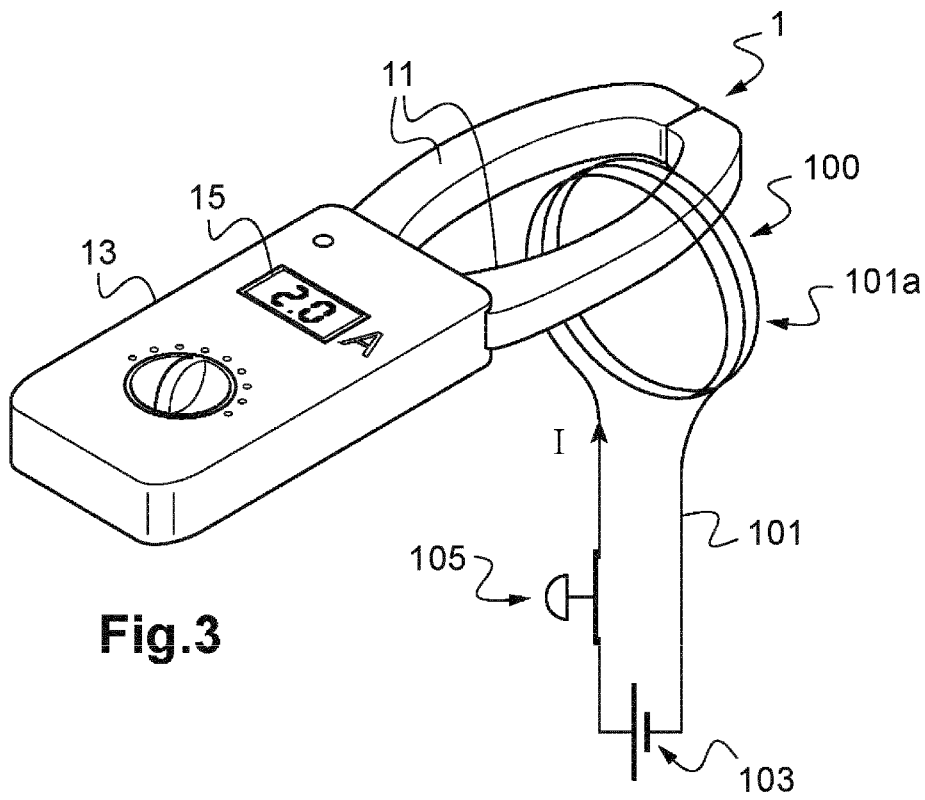
FIG. 3 shows a variant of the electrical circuit of FIG. 2 provided with a conductor having several windings.
Figure 4:
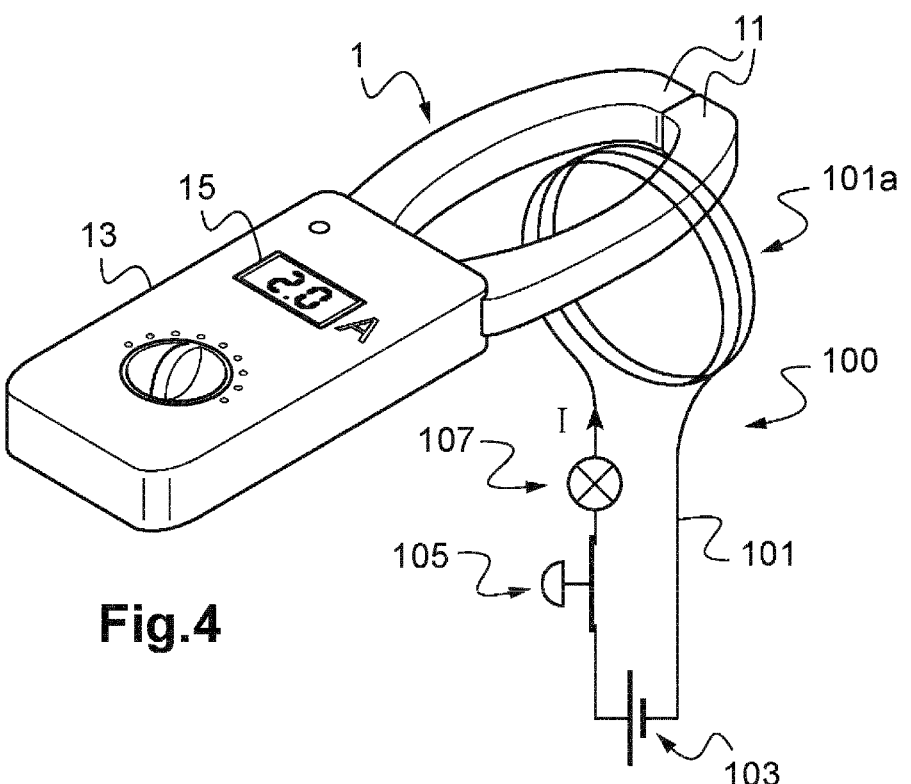
FIG. 4 shows a variant of the electrical circuit of FIG. 3 provided with a light source.

The electrical conductor 101 has at least one winding 101*a*. Only one winding 101*a* may be provided as shown in FIG. 2 or a plurality of windings 101*a* may be provided as shown in FIGS. 3 to 6.

At least during a testing or verification phase of the current clamp 1, the winding(s) 101*a* of the electrical conductor 101 are arranged around a jaw 11 of the current clamp 1. Part of the windings 101*a* is then surrounded by the jaws 11 of the current clamp 1.

The electrical conductor 101 is configured to be electrically connected to a DC source so as to be able to be passed through by a direct current of a predetermined intensity I.

This predetermined intensity I can be defined as a function of the number of windings 101*a* of the electrical conductor 101 and of the intensity value to be measured by the current clamp 1, which corresponds to a predetermined test value, for example on the order of a few amps. In other words, for power and energy saving, the predetermined intensity I and the number of windings 101a can be defined so that their product corresponds to the so-called test intensity value which is predetermined. As a purely illustrative and non-limiting example, if the intensity value to be measured by the predetermined current clamp 1 is 2 A, the electrical conductor 101 may have twenty windings 101a and the intensity I intended to run through this electrical conductor 101 during the test may be 100 mA.

Advantageously, the electrical circuit 100 comprises at least one electrical accumulator 103 or a battery, at the terminals of which the electrical conductor 101 is connected. This makes it possible to form the direct current source in order to carry out the test or the verification of the current clamp 1. It may for example be a single-use or rechargeable battery integrated into the electrical circuit 100. This integration of the DC power source into the 100 electrical circuit increases its practicality.

Furthermore, the electrical circuit 100 comprises a switch 105 electrically connected to the electrical conductor 101.

More specifically, the electrical accumulator 103 or battery, and the switch 105 can be arranged in series. Thus, the electrical conductor 101, the accumulator 103 or the battery, and the switch 105 form a closed loop.

The switch 105 is capable of taking at least one position preventing the flow of current in the electrical conductor 101 and a position allowing the flow of current in the electrical conductor 101. In other words, the switch 105 makes it possible to start or stop the circulation in the electrical conductor 101, the direct current coming from the DC source such as the electrical accumulator 103 or the battery. Thus, when the switch 105 is in the allowing position, a continuous current of a predetermined intensity I can run through the electrical conductor 101. If the current clamp 1 is functional and properly calibrated, it can measure this current. In particular, the current clamp 1 must be able to measure an intensity value representative of the predetermined intensity I.

In addition, the electrical circuit 100 can include a light source 107 (see FIGS. 4 to 6) configured to emit light when DC current flows through the electrical conductor 101. This light source 107 is arranged in series with the switch 105, and in this example also with the electrical accumulator 103 or the battery. For example, it may be at least one lamp, or in particular one or more light-emitting diodes. This provides an indicator and simple visual feedback to the operator that direct current is indeed flowing within the electrical circuit 100 and, for example, that the integrated battery comprising the accumulator(s) 103 is correctly supplying the electrical circuit 100.

Finally, as mentioned above, such an electrical circuit 100 may not be integrated into the current clamp 1, but may be associated with the current clamp 1 only when a test or check is to be carried out.

With reference to FIGS. 1 to 4, the electrical circuit 100 is mounted in the housing 3, which is separate from the current clamp 1. The housing 3 may comprise an electrically insulating material, such as a plastic material.

The housing 3 separate from the current clamp 1 advantageously has an opening 31 through which a jaw 11 of the current clamp 1 can be inserted when a test of the current clamp must be carried out using the electrical circuit 100. The electrical conductor 101 is received inside the housing 3 so as to wind up to form the winding(s) 101a, around this opening 31. Thus, when the jaw 11 of the current clamp 11 passes through the opening 31, the winding(s) 101a of the electrical conductor 101 are arranged around this jaw 11. A part of the electrical conductor 101 is then located in the space formed between the two jaws 11 of the current clamp 1.

The housing 3, which is separate from the current clamp 1, may further comprise an actuating member 5, which is arranged on the housing 3 so that it can be operated by an operator when the current clamp 1 is to be tested or checked. This actuating member 5 is arranged in mechanical contact with the switch 105 so as to be able to drive the switch 105 into the allowing position. Additionally, the actuating member 5 can take at least two positions, each associated with a position of the switch 105. It can be carried out for example in the form of a push-button.

Furthermore, when the electrical circuit 100 comprises a light source 107 as described above, the housing 3 separate from the current clamp 1 advantageously has a region, for example in the shape of a dome, made from a material that lets through light, transparent or translucent, and opposite which the light source 107 is arranged.

Alternatively, the electrical circuit 100 may be integrated into the current clamp 1. In this case, the current clamp 1 is capable of self-testing. The integration of the electrical circuit 100 into the current clamp 1 eliminates the need for an additional device or housing to test the current clamp 1.

The electrical circuit 100 can be mounted at least partially on the outside of the housing of the current clamp 1, as shown in FIG. 5. The electrical circuit 100 forms an external circuit of the current clamp 1 with the winding(s) 101a of the electrical conductor 101 attached around one of the jaws 11 of the current clamp 1. The rest of the electrical circuit 100 may be arranged at the body 13 or handle of the current clamp 1.

Alternatively, the electrical circuit 100 can be mounted in whole or in part inside the housing of the current clamp 1.

According to the example of FIG. 6, the electrical circuit 100 is completely accommodated inside the housing of the current clamp 1.

More specifically, the winding(s) 101a of the electrical conductor 101 are arranged around the ferromagnetic material forming one of the jaws 11. It may in particular be a fixed jaw 11.

The rest of the electrical circuit 100 may be arranged inside the housing at the body 13 or handle of the current clamp 1.

According to this variant, the housing of the current clamp 1 may comprise an actuating member 5, as previously described with reference to FIG. 1 in the case of the housing 3 separate from the current clamp 1.

This actuating member 5 is arranged on the housing, in particular at the body 13 of the current clamp 1, so as to be able to be maneuvered, for example by an operator. The actuating member 5 can be mounted so that it protrudes from the housing. Alternatively, the actuating member 5 can be mounted level with the outer surface of the housing. In other words, it may be flush with the housing.

It is arranged in mechanical contact with the switch and may additionally be capable of taking up at least two positions associated with the switch positions, so as to be able to drive the switch into the allowing position when the operator wishes to test the current clamp 1.

The housing of the current clamp 1 may further comprise in particular at the body 13 of the current clamp, a region made of a material that lets through light, transparent or translucent, opposite which the light source 107 is arranged, when provided.

Thus, when a current clamp 1 must be tested, to determine whether it is properly calibrated (direct current) and is not damaged or faulty, a method for verifying the current measurement by this current clamp 1 can be implemented.

When the electrical circuit 100 is not integrated into the current clamp 1, and in particular is mounted in a housing 3 separate from the current clamp 1, the winding(s) 101*a* of the electrical conductor 101 are positioned around a jaw 11 of the current clamp 1.

The verification method can be initiated by maneuvering the actuating member 5, for example by pressing this member, so as to place the switch 105 in the position allowing the flow of the current in the electrical conductor 101.

When the electrical conductor 101 is crossed by a predetermined direct current of intensity I, if the current clamp 1 is measuring and indicating, for example on the display screen 15, an intensity value representative of this predetermined intensity I, the operator can conclude that the current clamp 1 is properly calibrated and functioning. In this case, the tested current clamp 1 can be used with confidence to carry out safety checks on photovoltaic strings, for example before opening a string for maintenance.

Conversely, if the current clamp 1 does not measure current or a false value, this indicates a fault or miscalibration of the current clamp 1. This makes it possible to avoid using altered or defective clamps 1, which would give a false feeling of security to an operator who is to perform a maintenance operation, for example on a photovoltaic string.

The verification method may stop when the test current is interrupted for example by maneuvering the actuating member 5 again.

The electrical circuit 100 as described above offers a simple and inexpensive solution for testing the current clamp 1, using the principle of current measurement of such a clamp using an electrical conductor 101 arranged at least in part between the jaws 11 of the current clamp 1.

In addition, it can be integrated into the current clamp 1 directly or be made in the form of a simple tool which can be carried and easily used on a worksite while ensuring a reliable and robust result.

The invention claimed is:

1. An electrical current-measurement verification circuit (100) for a current clamp (1), the current clamp configured to operate in a calibration mode or a clamp operation mode, the circuit (100) comprising:

at least one electrical conductor (101) having at least one winding (101*a*) configured to be arranged around a jaw (11) of the current clamp, said at least one conductor (101) being configured to be electrically connected to a source of direct current so as to have a direct current of a predetermined intensity (I) flowing through itthe at least one electrical conductor (101), and a switch (105) electrically connected to said at least one conductor (101) andto switch in a verification mode after the calibration mode and before the clamp operation mode, the switch (105) configured to take at least:

a position preventing the direct current from flowing in said at least one conductor (101) during the verification mode; and a position allowing the direct current to flow in said at least one conductor (101) during the verification mode, so as to verify whether the current clamp (1) is measuring an intensity value representative of the predetermined intensity (I) flowing through said at least one conductor (101) when the switch (105) is in the allowing position.

2. The circuit (100) according to claim 1, in which said at least one conductor (101) comprises at least two windings (101*a*) configured to be arranged around the jaw (11) of the current clamp (1), so that when the switch (105) is in the allowing position and direct current flows through the at least one conductor (101), the intensity value to be measured by the current clamp (1) corresponds to the predetermined intensity (I) flowing through the at least one conductor (101), multiplied by the number of windings (101*a*).

3. The circuit (100) according to claim 1, further comprising a battery or at least one electrical accumulator (103) forming the direct current source, arranged in series with the switch (105), said at least one conductor (101) being electrically connected to the terminals of the battery or of said at least one electrical accumulator (103), such that said at least one conductor (101), the battery or said at least one accumulator (103) and the switch (105) form a closed loop.

4. The circuit (100) according to claim 1, further comprising a light source (107) arranged in series with the switch (105), and configured to emit light when the switch (105) is in the allowing position and said at least one conductor (101) has direct current running through said at least one conductor (101).

5. The circuit (100) according to claim 1, mounted in a housing (3) comprising an actuating member (5) arranged on the housing (3) by being in mechanical contact with the switch (105), so as to be able to be maneuvered to drive the switch (105) into the allowing position.

6. The circuit (100) according to claim 4, wherein the light source (107) is arranged opposite a region of a housing made of a material that lets through transparent light or translucent light.

7. The circuit (100) according to claim 5, wherein the housing (3) is separate from the current clamp (1) and has an opening (31) around which said at least one conductor (101) winds inside the housing (3), and configured to be passed through by the jaw (11) of the current clamp (1).

8. A current clamp (1) comprising the electrical current-measurement verification circuit (100) according to claim 1.

9. The current clamp (1) according to claim 8, further comprising:

two jaws (11) made of ferromagnetic material, and a housing made of insulating material, at least a part of which is arranged around the jaws (11) of said clamp (1), and wherein said circuit (100) is mounted in the housing of said clamp (1) so that said at least one winding (101*a*) of said at least one conductor (101) is arranged around the ferromagnetic material forming one of the jaws (11).

10. A method for verifying the current measurement of a direct-current clamp (1), by means of an electrical circuit (100) for verifying current measurements according to claim 1, comprising the following steps:

positioning said at least one winding (101*a*) of said at least one conductor (101) around a jaw (11) of the current clamp (1), if said circuit (100) is mounted in a housing (3) distinct from the current clamp (1), placing the switch (105) in the position allowing the direct current to run through said at least one conductor (101), and verify, during a verification mode after the calibration mode and before the clamp operation mode, whether the current clamp (1) is measuring an intensity value representative of the predetermined intensity (I) of the direct current running through said at least one conductor (101).

11. The circuit (100) according to claim 5, wherein a light source (107) is arranged opposite a region of the housing (3) made of a material that lets through, transparent light or translucent light.

* * * * *